United States Patent
Le Phan (10) Patent No.: US 7,382,664 B2
(45) Date of Patent: Jun. 3, 2008

(54) SIMULTANEOUS READING FROM AND WRITING TO DIFFERENT MEMORY CELLS

(75) Inventor: Kim Le Phan, Eindhoven (NL)

(73) Assignee: NXP B.V., Eindhoven (NL)

( * ) Notice: Subject to any disclaimer, the term of this patent is extended or adjusted under 35 U.S.C. 154(b) by 481 days.

(21) Appl. No.: 10/549,559

(22) PCT Filed: Mar. 17, 2004

(86) PCT No.: PCT/IB2004/050274

§ 371 (c)(1),
(2), (4) Date: Sep. 19, 2005

(87) PCT Pub. No.: WO2004/084226

PCT Pub. Date: Sep. 30, 2004

(65) Prior Publication Data

US 2006/0209600 A1  Sep. 21, 2006

(30) Foreign Application Priority Data

Mar. 20, 2003 (EP) ................... 03100725

(51) Int. Cl.
*G11C 7/10* (2006.01)

(52) U.S. Cl. .................. 365/189.04; 365/158

(58) Field of Classification Search ........ 365/158, 365/171, 173, 189.01, 189.04, 189.14, 230.04, 365/243; 711/200, 202, 217, 218, 220

See application file for complete search history.

(56) References Cited

U.S. PATENT DOCUMENTS

| 4,672,583 A | 6/1987 | Nakaizumi et al. |
| 5,640,343 A | 6/1997 | Gallagher et al. |
| 6,115,323 A * | 9/2000 | Hashimoto ............... 365/238.5 |
| 2003/0193831 A1 * | 10/2003 | Baker ..................... 365/225.5 |

FOREIGN PATENT DOCUMENTS

| WO | WO03098637 | 4/2003 |
| WO | WO03034437 | 11/2003 |

* cited by examiner

*Primary Examiner*—Richard T. Elms
*Assistant Examiner*—Harry W Byrne
(74) *Attorney, Agent, or Firm*—Peter Zawilski (57) ABSTRACT

A nonvolatile memory array includes a grid of word lines WL1, . . . , WL6 and bit lines BL1, . . . , BL8. Of a plurality of memory cells 210, each memory cell is located at an intersection region of one of the word lines and one of the bit lines. A read/write circuit 280 for reading/writing a data word including a plurality of bits is operative to map each pair of sequential bits of the data word to a respective pair of memory cells located at intersection regions of both a different word line and a different bit line.

10 Claims, 7 Drawing Sheets

SIMULTANEOUS READING FROM AND WRITING TO DIFFERENT MEMORY CELLS

FIELD OF THE INVENTION

The invention relates to reading and writing of a non-volatile memory array, in particular a magnetic random access memory (MRAM), and to a method of converting an address for accessing a non-volatile memory.

BACKGROUND OF THE INVENTION

As memory sizes increase, the range of applications using non-volatile memories increases sharply. For example, it has already become possible to store audio in non-volatile solid-state memories, e.g. using MP3 coding. It is expected that in the foreseeable future it will be possible to store a movie in a non-volatile memory at reasonable costs. Using such non-volatile memories enables relatively cheap and reliable rendering devices, such as an MP3 player, and opens many new applications in hand-held computer-like devices, such as PDAs and new generation mobile phones. Magnetic or Magnetoresistive Random Access Memory (MRAM) is currently being considered by many companies as a successor to flash memory. It has the potential to replace all but the fastest static RAM (SRAM) memories. It is a non-volatile memory device, which means that no power is required to sustain the stored information. This is seen as an advantage over most other types of solid-state memory. The MRAM concept uses magnetisation direction in a magnetic multi-layer device as information storage and the resultant resistance difference for information readout. Each magnetic memory cell is able to store at least two states which represent either a "1" or a "0". An array of magnetic memory cells is often called magnetic RAM or MRAM.

Different kinds of magnetoresistive (MR) effects exist, such as the anisotropic magnetoresistive (AMR) effect and the Giant Magneto-Resistance effect (GMR). For MRAMs, it is preferred that the Tunnel Magneto-Resistance (TMR) effect is used. In a Magnetic Tunnel Junction (MTJ), the memory cells are formed using a stack of thin films of which at least two are ferromagnetic or ferrimagnetic, and which are separated by an insulating tunnel barrier. The magnetoresistance results from the spin-polarized tunnelling of conduction electrons between the two ferromagnetic or ferrimagnetic layers. The tunnelling current which flows in the perpendicular direction to the plane of the stack depends on the relative orientation of the magnetic moments of the two ferromagnetic or ferrimagnetic layers. The tunnelling current is observed to be the largest (or thus resistance to be the smallest) when the magnetisation directions of the films are parallel and tunnelling current is the smallest (or thus resistance the largest) when the magnetisation directions of the films are anti-parallel.

MTJ memory elements generally include a layered structure comprising a fixed or pinned ferromagnetic layer (PFL), a free ferromagnetic layer (FFL) and a dielectric barrier in between. The PFL layer has a magnetic vector that always points in the same direction. The magnetic vector of the FFL layer is free, but constrained within the easy axis of the layer, which is determined chiefly by the physical dimensions of the element. The magnetic vector of the free layer points in either of two directions: parallel or anti-parallel with the magnetisation direction of the pinned layer, which coincides with the said easy axis. These two possible directions of magnetization of the FFL layer along this easy axis define the two states of the memory cell. The magnetization direction of the PFL layer is more difficult to change than that of FFL. In the range of fields applied by currents through the bit and word lines, the magnetization direction of PFL is fixed or pinned. The magnetic fields applied to write the memory cell are large enough to reverse the direction of magnetization of FFL, but not the direction of PFL. Thus, the magnetization of PFL does not change direction during operation of the memory cells in the MRAM.

Figure 1:
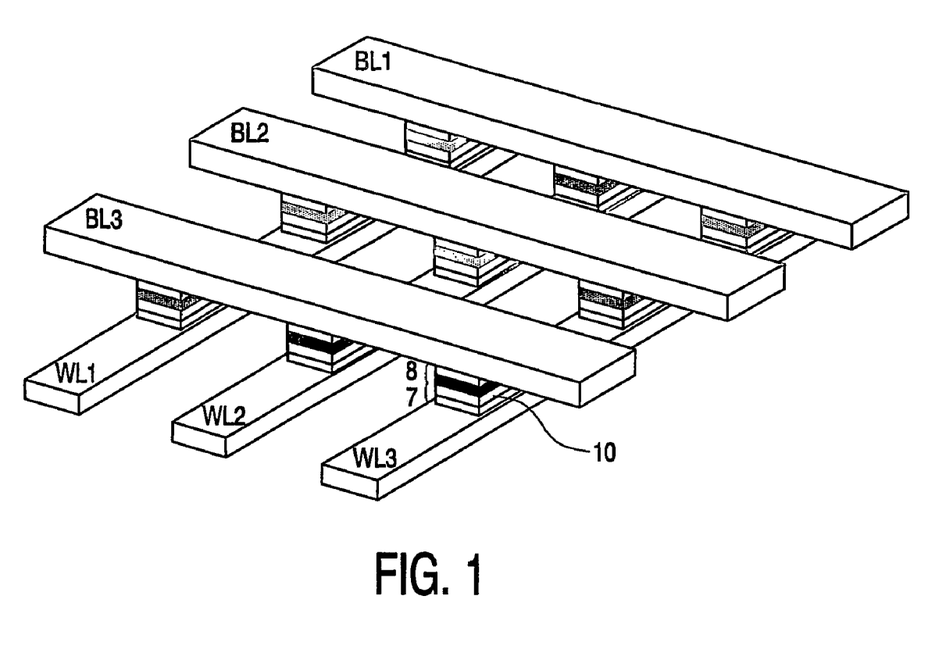
FIG. 1 shows a cross-bar, memory with MTJ cells.

For accessing the memory elements, word lines and bit lines are patterned separately into two metal layers under and above the MTJ stack. Each memory element is located at a cross-point region of a word line and a bit line. Word lines extend along rows of memory elements, and bit lines extend along columns of memory elements. During reading a current is directed through a cell to be read. Since cells share word and bit lines, it is known to use for each cell a transistor to control through which cell the read current is fed. Such MRAMs are referred to as 1T1MTJ MRAMs (one-transistor per one MTJ cell). U.S. Pat. No. 5,640,343 describes an alternative MRAM that uses a diode per cell to control the reading. The advantage of this so-called 0T1MTJ MRAM is that it uses a small chip area FIG. 1 illustrates the known 0T1MTJ MRAM. The MRAM array of magnetoresistive memory cells includes a set of electrically conductive traces that function as parallel word lines WL1, WL2, and WL3, and in a horizontal plane, and a set of electrically conductive traces that function as parallel bit lines BL1, BL2, and BL3 in another horizontal plane. The bit lines are oriented in a different direction, usually at right angles to the word lines, so that the two sets of lines intersect when viewed from above. A memory cell, such as typical memory cell 10, is located at each crossing point of the word lines and bit lines in the intersection region vertically spaced between the lines. The memory cell 10 is arranged in a vertical stack and may include a diode-like device 7 and a magnetic tunnel junction (MTJ) 8. During operation of the array, current flows in a vertical direction through the cell 10. The vertical current path through the memory cell permits the memory cell to occupy a very small surface area. Contact to the word lines, the MTJ, the diode, and the contact to the bit line all occupy the same area. The array is formed on a substrate, such as a silicon substrate on which there would be other circuitry (not shown). The detailed construction of the diode-like device and the MTJ are not relevant for the invention.

The MTJ 8 changes resistance when the direction of magnetization of the FFL switches from being parallel to being antiparallel to the magnetization direction of PFL. As will be explained, this occurs as a result of magnetic fields generated when current is passed through the bit and word lines. When a sufficiently large current is passed through both a write line and a bit line of the MRAM, the self-field of the so combined currents at the intersection of the write and bit lines will rotate the magnetization of the FFL of the single particular MTJ located at the intersection of the energized write and bit lines. The current levels are designed so that the combined self-field exceeds the switching field of the FFL. This self-field is designed to be much smaller than the field required to rotate the magnetization of the PFL. The cell array architecture is designed so that the write currents do not pass through the MTJ itself. The memory cell is read by passing a sense current perpendicularly through the diode and MTJ from the PFL through the tunnel junction barrier to the FFL (or vice versa). The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The tunneling current is spin polarized, which means that the electrical current passing from one of the ferromagnetic layers, for example, the PFL, is predominantly composed of electrons of one spin type (spin up or spin down, depending on the orientation of the magnetization of the ferromagnetic layer). The tunneling probability of the charge carriers is highest when the magnetic moments of both layers are parallel, and is lowest when the magnetic moments are antiparallel. As a result, the two possible magnetization directions of the FFL uniquely define two possible bit states (0 or 1) of the memory cell.

To read and write the 0T1MTJ MRAM only the bit lines and the word lines are required; no other control lines from outside the array are necessary to read or write the memory state of the memory cells. This provides a very efficient memory array. A selected cell, e.g. cell 10 of FIG. 1, is written by passing current $I_b$ through the bit line BL3 and current $I_w$ through word line WL3 connected to the cell 10. Bit line control circuitry is attached to the bit lines and controls $I_b$. Word line control circuitry is attached to the word lines and controls $I_w$. The magnetic field produced by either $I_b$ or $I_w$ alone in the region of the cells is less than the magnetic field required to change the magnetic state in a cell, so half-selected cells (those over which only $I_b$ or $I_w$ alone is passing) are not written. However, the combination of magnetic fields from $I_b$ and $I_w$ is sufficient to change the state of selected memory cell 10. At least one of the currents $I_b$ or $I_w$ has to be reversible to write the two different magnetic states of the cell 10. The bit lines are also connected to the sensing circuitry, which may be part of bit line control circuitry. The voltage level of the bit lines during a write operation is near a voltage $V_b$ for convenience in providing for the bidirectional currents. The voltage level of the word lines is near a more positive voltage $V_w$. The voltage levels are selected to ensure that all diodes in the array are reverse biased so that the currents $I_b$ and $I_w$ do not flow vertically through any memory cell. In a read operation a forward bias voltage is established across the selected cell 10 by pulling the word line WL3 voltage down to $V_b$, and raising the bit line BL3 voltage to $V_w$. During a read, unselected bit lines BL1, BL2 remain at the standby voltage level $V_b$, and unselected word lines WL1, WL2 remain at the standby voltage level $V_w$. Half-selected cells have zero voltage drop from word line to bit line and do not conduct. The resistance of the selected memory cell determines the sense current that flows from the bit line through the selected memory cell to the word line. In the sense circuitry, this current is compared to a reference current set to a value halfway between the expected values for the two possible states of the memory cell and the difference is amplified to read the data stored in selected cell 10.

In particular for mobile devices, it is very important to reduce the power consumption of memory devices. For non-volatile memories in general the writing operation is most power-consuming. For example, a write operation on MRAM elements involves two current pulses of several mA, that must be sent simultaneously through a bit line and a word line for each bit of a word to be written.

SUMMARY OF THE INVENTION

It is an object of the invention to reduce the power consumption of a non-volatile memory device.

To meet the object of the invention, a nonvolatile memory array includes a first plurality of electrically conductive lines (hereinafter "word lines"); a second plurality of electrically conductive lines (hereinafter "bit lines"); a plurality of memory cells, each memory cell being located at an intersection region of one of the word lines and one of the bit lines; and a read/write circuit for reading/writing a data word including a plurality of bits; the circuit being operative to map each pair of sequential bits of the data word to a respective pair of memory cells located at intersection regions of both a different word line and a different bit line.

Bits of a memory are arranged in words each with a plurality of bits. The word is the smallest unit that can be accessed (written or read) in the memory. Traditionally, during a write operation the read/write circuit in the memory writes al sequential bits of a word and reads all sequential bits of a word during a read operation. No random access to individual bits is possible. In general, words can be accessed randomly in a random access memory (RAM). Since during a read or write operation all bits of a word are accessed, conventionally the sequential bits of a word are mapped to physically sequential memory cells, i.e. cells with a same word line number and sequentially increasing bit line number. This normally means that if a data bit of a word is being written (using high currents) it is not possible to use the involved word line and bit line for other purposes, such as reading another cell. For example for a 0T1MTM device applying the correct bias level to the selection device, that typically is a diode, is important making it practically impossible to use the bit line and word line involved in a writing operation for reading another cell. This implies that using the conventional mapping of a word to memory cells, it is not possible to simultaneously access other bits of the same word. The inventor had the insight that sequential bits can be mapped such that they use different bit lines and word lines enabling parallel access to sequential bits of word. The principle can be applied to MRAM, but also to other types of "cross-bar" memories such as the emerging molecular memory.

According to the measure of the dependent claim 2, the interfacing circuit is operative to write a data word of a plurality of bits $b_i$ (i=1 . . . N) by reading a current value of bit $b_i$ and only performing a writing operation for bit $b_i$ if the current value and a new value of $b_i$ differ; and performing the conditional write operation for bit $b_i$ and the read operation for bit $b_{i+1}$ simultaneously. In this way on average half the bits do not need to be overwritten, since they already have the desired value. Since for non-volatile memories, such as MRAM, the write current is much higher than the read current this provides a power reduction. The parallel writing of $b_i$ and reading of bit $b_{i+1}$, made possible by the present invention, enables this operation without reducing the performance of the memory.

It should be noted that the non-prepublished patent application WO03034437 describes a new MRAM device wherein, in a 'toggle write' mode, to be able to write the memory element into the desired state, the initial state of MRAM device must first be read and compared to the state to be written. The MRAM device is then written to only if the stored state and the state to be written are different. It is described that one of the advantages of this method is that the power consumed is lowered because only the differing bits are switched. This patent application does not describe a method for performing the successive reading and writing. The memory bitmap according to the invention can effectively be employed in the new MRAM device for obtaining a high performance.

According to the measure of the dependent claim 3, a data word includes a plurality of sequential bits $b_i$ (i=1 . . . N)

indicated by a word memory address; the read/write circuit being operative to convert the word memory address to a corresponding physical memory address for bit $b_1$ which includes a word line number $y_1$ and a bit line number $x_1$ and to generate respective bit addresses for the successive bits in the word by each time incrementing the bit line number and changing the word line number ($y_{i+1} \neq y_i$). Incrementing the bit line number is an easy way to generate different bit line number for the successive bits. The increment value is preferably one, but may also be a different value. Such a value may be a fixed value or a bit location specific value. In this way various patterns of mapping a word to the memory cell can be achieved. It will be appreciated that the same principle can be applied if the word lines and the lines are interchanged.

In the preferred mapping, the bit line number is determined in a conventional way and a simple conversion of the word line number occurs. According to the measure of the dependent claim 4, the read/write circuit is operative to determine $y_{i+1}$ as:

$y_{i+1} = y_1 + ((x_1+i+1) \text{MOD } 2)$, if $y_1$ is odd and
$y_{i+1} = y_1 - ((x_1+i+1) \text{MOD } 2)$, if $y_1$ is even.
with i=1 . . . N-1

Conventionally, for sequential bits within a word the bit line number is each time incremented by one (and thus automatically different for two subsequent bits). The word line number is usually the same for subsequent bits within a word. In the preferred embodiment, the word line toggles between two values for successive bits within a word, giving a zig-zag pattern. It will be appreciated that other mappings are also possible.

According to the measure of the dependent claim 5, the read/write circuit is operative to map a group of a plurality of words with respective sequential addresses such that for each word $W_i$ and $W_k$ of the group a sequentially last bit of word $W_i$ and a sequentially first bit of word $W_k$ are mapped to a respective pair of memory cells located at intersection regions of both a different word line and a different bit line. In this way it is possible to continue parallel operations for a bit sequence that covers a plurality of sequential words. It is also possible to sequentially access words randomly chosen within the group without having to wait.

Preferably, the memory array is a 0T1MTJ MRAM, wherein each memory cell includes a magnetic tunnel junction. Each memory cell may include a selection device electrically connected in series with the magnetic tunnel junction. Such a selection device may be diode, or a device having a non-linear V-I characteristic.

To meet an object of the invention, a method of converting an address for accessing a data word in a nonvolatile memory to a sequence of identifications of memory locations, where a data word includes a plurality of sequential bits $b_i$ (i=1 . . . ) indicated by a word memory address, includes converting the word memory address to a corresponding physical memory address for bit $b_1$ which includes a word line number $y_1$ and a bit line number $x_1$ and to generate respective bit addresses for the successive bits in the word by by changing the bit line number ($x_{i+1} \neq x_i$) and changing the word line number ($y_{i+1} \neq y_i$), for i=1 . . . N-1.

These and other aspects of the invention are apparent from and will be elucidated with reference to the embodiments described hereinafter.

DETAILED DESCRIPTION OF THE PREFERRED EMBODIMENT

FIG. 1 illustrates an MRAM, such as the known 0T1MTJ MRAM, in which the invention may be used. The MRAM array of magnetoresistive memory cells includes a set of electrically conductive traces that function as parallel word lines WL1, WL2, and WL3, and in a first horizontal plane, and a set of electrically conductive traces that function as parallel bit lines BL1, BL2, and BL3 in a second horizontal plane. The bit lines are oriented in a different direction, usually at right angles to the word lines, so that the two sets of lines intersect when viewed from above. A memory cell, such as a typical memory cell 10, is located at each crossing point of the word lines and bit lines in the intersection region vertically spaced between the lines. The memory cell 10 is arranged in a vertical stack and may include a selection device 7 and a magnetic tunnel junction (MTJ) 8. Preferably, the selection device is transistor-less, for example a diode, or a device having a non-linear V-I characteristic. Typically, MTJ memory elements include a layered structure comprising a fixed or pinned ferromagnetic layer (PFL), a free ferromagnetic layer (FFL) and a dielectric barrier in between. The magnetic tunnel junction may be a known MTJ, such as the one described in U.S. Pat. No. 5,640,343. In a preferred embodiment, the MTJ corresponds to a cell as described in the non-prepublished patent application WO03034437. In an exemplary embodiment, at least FFL includes a synthetic anti-ferromagnetic layer. The synthetic anti-ferromagnetic layer material includes at least two ferromagnetic layers which are anti-ferromagnetically coupled. Preferably, the ferromagnetic layers are anti-ferromagnetically coupled by sandwiching an anti-ferromagnetic coupling spacer layer between each adjacent ferromagnetic layer. The synthetic anti-ferromagnetic layer material may be a tri-layer structure of a ferromagnetic layer/anti-ferromagnetic coupling spacer layer/ferromagnetic layer. Unlike the structure shown in FIG. 1, for these MTJs it is preferred that the easy magnetic axis of at least the ferromagnetic layer (including induced anisotropy and/or shape anisotropy) is set at a 45 degrees angle between the word line and digit line. A same anisotropy orientation may be set for PFL.

WO03034437 also describes a so-called 'toggle writing' method. When using the toggle writing method, there is a need to determine the initial state of the MRAM device before writing because the state is switched every time the MRAM device is written to, regardless of the direction of the currents as long as the same polarity current pulses are chosen for both the word line and digit line. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device must first be read and compared to the state to be written. The reading and comparing may require additional logic circuitry, including a buffer for storing information and a comparator for comparing memory states. The MRAM device is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. When this memory stack is used in the 1T1MTJ memory type, writing on one cell while reading the next cell might be possible because the digit line (one of the two lines used for writing) is separated from the read current path. However, if the stack is used in the 0T1MTJ memory type, both read and write operations share the same set of bit lines and word lines. That means the "toggle writing" mode always requires read before write, thus significantly increases the total write time. The memory bitmap according to the invention provides a solution for this.

In general RAM technology, information is grouped and handled in complete words. Each word consists of a plurality of bits, for example, 4, 8 or 16 bits, etc. Typically, the words themselves can be accessed randomly. Individual bits in a word can not be accessed randomly. An application requiring access to a bit only has to read the entire word. For a read or write operation to a word, an application specifies a word address. A read/write circuit converts the word address to a physical word line number and bit line number corresponding to the memory cell containing the first bit of the word. The read/write circuit then accesses all successive bits of the word by incrementing the bit line number by one and accessing the memory cell until the whole word is completed. In every word the bits are arranged in the physical row order; that means that successive bits within a word are lying on the same row. All bits and words have their fixed addresses in the memory bitmap.

Bit Memory Map

Figure 2:
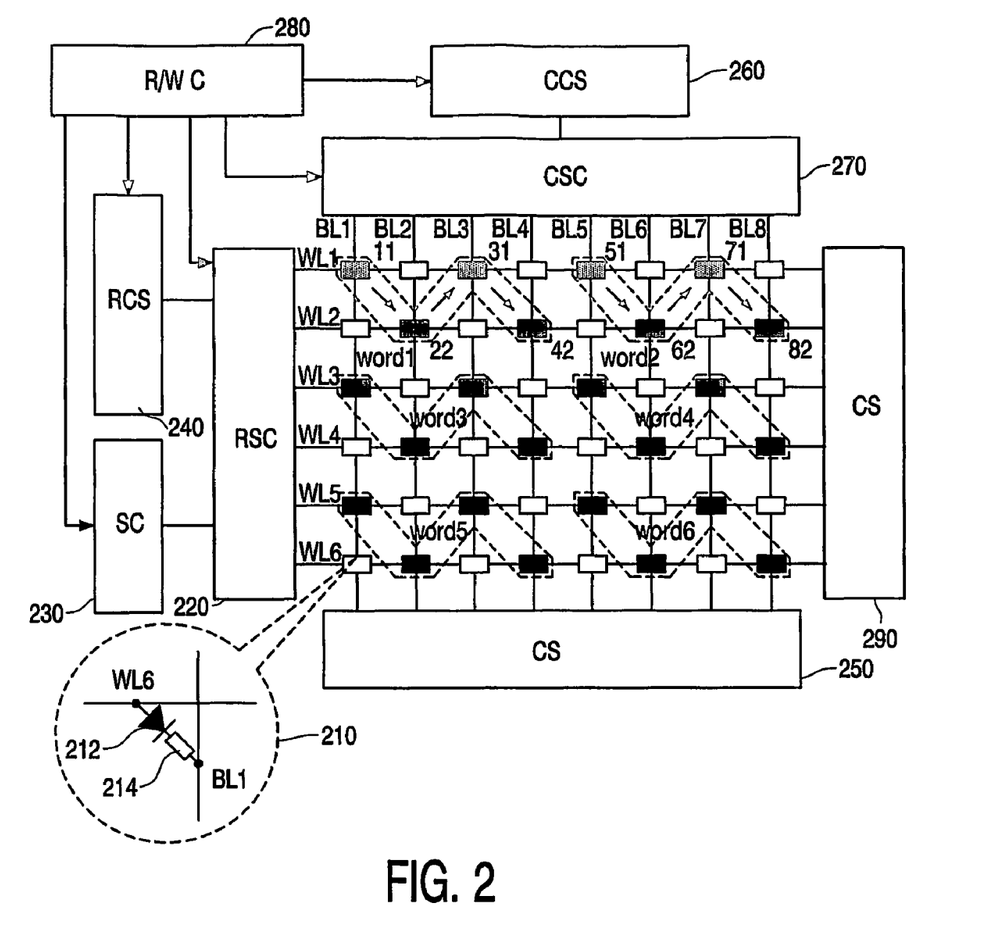
FIG. 2 shows an exemplary mapping pattern according to the invention for a first group of words.

FIG. 2 illustrates a memory array according to the invention wherein the memory bitmap is redefined so that the sequence of bits within one word does not follow the conventional inline order. According to the invention, adjacent bits within one word do not share the same bit line and do not share the same word line. The invention will be illustrated for a 0T1MTJ MRAM, but in principle it can be applied in any memory array that uses (or needs) conditional writing of bits (e.g. to save power) or parallel reading and writing of two successive bits. In particular, the mapping according to the invention allows read-while-write operation without introducing any extra lines. In the example of FIG. 2, the MRAM array consists of eight columns by six rows, and a word contains 4 bits. In reality, the numbers can be different. There are two orthogonal sets of lines lying on two different metallization planes. One set is referred to as the bit lines (column direction), indicated by BL1 to BL8; the other set is referred to as the word lines (row direction), indicated by WL1 to WL6. The memory elements (MTJ-diode stack) are located at the crossing points of the lines. This is illustrated for memory element 210. In the example, the memory element includes a selection device 212 in series with a MTJ 214. The selection device may be a diode or a device having a non-linear V-I characteristic, but also any other suitable 0T1MTJ memory cell may be used.

Figure 3:
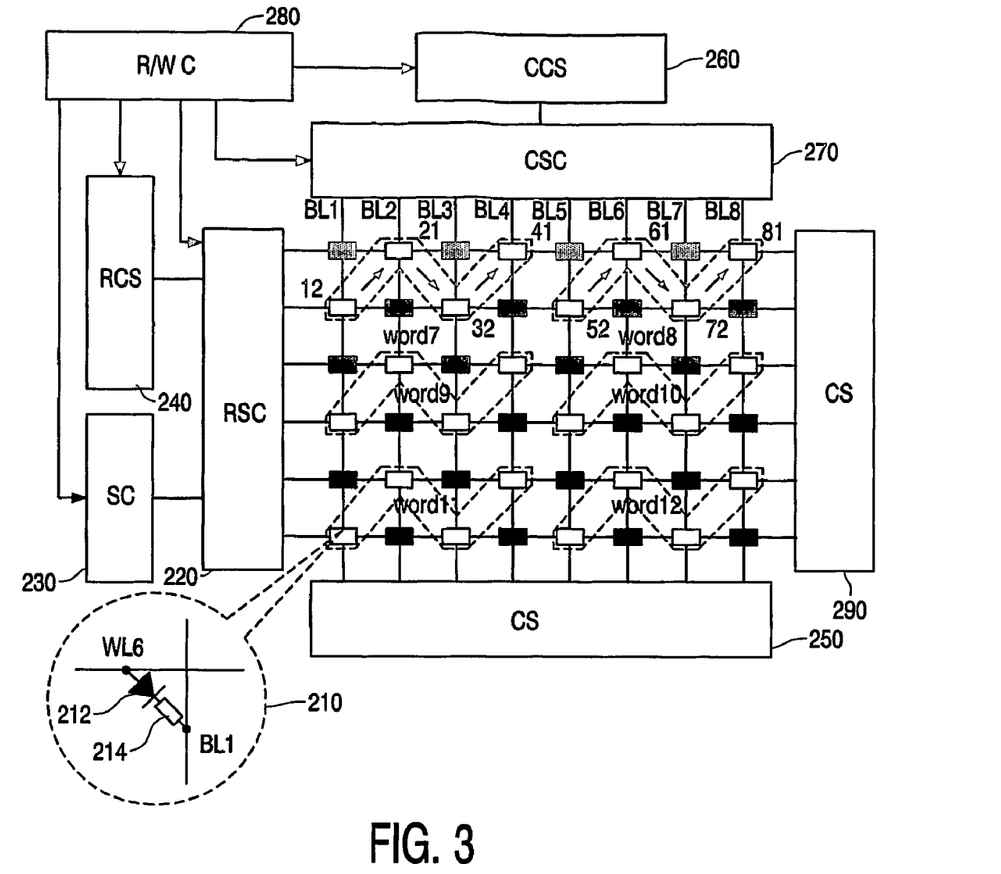
FIG. 3 shows an exemplary mapping pattern according to the invention for a second group of words.

In the conventional bitmap, the first word (word 1) contains cells (1-1), (2-1), (3-1), (4-1), where the first index represents the column number (bit line) and the second index represents the row number. Word 2 contains bits (5-1), (6-1), (7-1), (8-1), and so on. In this case bits of the same word lie in the same row. In the memory array according to the invention, this inline order is broken. FIG. 2 illustrates a suitable pattern for doing so. In this example, sequential bits of a word stored in a zigzag order is suggested: word 1 contains (1-1), (2-2), (3-1), (4-2); word 2 contains (5-1), (6-2), (7-1), (8-2), and so on until word 6 at the bottom-right corner. The sequences of bit access are shown as arrows in FIG. 2 for words 1 and 2. All the words from word 1 to word 6 occupy the gray cells, which amount to half of the total cells. These six words form a first group of words, referred to as group 1. FIG. 3 illustrates that in a similar manner, a second group of words, referred to as group 2, fill the rest of the array containing all white cells.

It will be appreciated that many mappings are possible. An effective way is to first convert the word address, which is for example specified by a processor under control of a program, to a physical address of the first bit of the word. This physical address includes a bit line number and a word line number. In the examples given here it will be assumed that words include an even number of bits and that an even number of words fits into a word line. Persons skilled in the art will be able to adapt the mapping for differently sized memories. Using the following definitions:

MA is the word address, e.g. supplied by a microprocessor, starting at MA=1 for the first word;
Nw is the number of words in a row,
Nr is the number of rows or word lines of the array
Ws is the word size (number of bits in a word),
Na is the total number of bits in the array.

The conversion of the word memory address to the physical address of the first bit and successive bits for the zig-zag patterns of FIGS. 2 and 3 may be described as follows: For words in group 1 (i.e. MA<=Na/(Ws/2))

$x_1 = [(MA-1) \text{ MOD } Nw]*Ws+1$
$y_1 = [(MA+Nw-1) \text{ DIV } Nw]*2-1$
$x_{i+1} = x_i + 1$
$y_{i+1} = y_1 + ((x_1+i+1) \text{ MOD } 2)$ For words in group 2: (i.e. MA>Na/Ws/2)
$x_1 = [(MA-1) \text{MOD } Nw]*Ws+1$
$y_1 = [(MA+Nw-1) \text{DIV } Nw]*2-Nr$
$x_{i+1} = x_i + 1$
$y_{i+1} = y_1 - ((x_1+i+1) \text{MOD } 2$ MOD is the function that returns the remainder of the division. That means (x MOD 2) is 0 when x is even and 1 when x is odd. In a preferred embodiment, successive bit line numbers are generated by incrementing the bit line number. In principle the increment factor can be chosen. Preferably, the increment is 1. As such, using $x_i$ to indicate the bit line number of bit $b_i$ in a word with N bits (i=1 to N) it follows simply that: $x_{i+1} = x_i + 1$.

In principle for each pair of successive bits the change in word line number can also be achieved by incrementing the word line number. As described above, such an increment may be with a fixed factor, preferably 1. It will be appreciated that if boundaries of the array are reached that a corrective measure is required to stay within the boundary (e.g including performing a modulo operation on the number of word lines in the array). To obtain the zig-zag pattern, no sequentially increasing word line number is created but instead a toggling operation is performed. Such a toggling can be expressed in many ways, for example in the way done above. The formulas show that compared to the traditional memory map, only the mapping of the row number (y) has to be changed while the column number (x) is determined in the normal way. It will be appreciated that many different zig-zag patterns can be easily achieved.

Word Memory Map

In a preferred embodiment, the read/write circuit is operative to map a group of a plurality of words $W_i$ with respective sequential addresses such that a sequentially last bit of word $W_i$ and a sequentially first bit of word $W_{i+1}$ are mapped to a respective pair of memory cells located at intersection regions of both a different word line and a different bit line. More in general, for all words $W_i$ and $W_k$ in the group, a sequentially last bit of word $W_i$ and a sequentially first bit of word $W_k$ are mapped to a respective pair of memory cells located at intersection regions of both a different word line and a different bit line. This allows fast successive access to randomly chosen words within the group. Using the zig-zag pattern of FIG. 2, all words in group 1 begin with an (odd-odd) bit and end with an (even-even) bit. In this way, a transition from a last bit of a word of group 1 to a first bit of another word of group 1 involves a change of both the bit line (from even to odd) and of the word line (also even to odd). Consequently, a sequential bit operation like reading bit i+1 while writing bit i can be continued also over word boundaries of words within group 1. From FIG. 3 it can be observed that all words in group 2 start with an (odd-even) bit and end with an (even-odd) bit, for instance word 7 contains (1-2), (2-1), (3-2), (4-1) and word 8 contains (5-2), (6-1), (7-2), (8-1), and so on. Again here the operation can be continued over word boundaries for words within group 2, since a transition from a last bit of a word of group 2 to a first bit of another word of group 2 involves a change of both the bit line (from even to odd) and of the word line (from odd to even). In many applications, several words are accessed sequentially. As long as these words fall within the same group, a parallel reading/writing operation, as will be described in more detail below, is always possible without loosing cycles. Persons skilled in the art will be able to easily determine the groups of sequential words that comply with the described rule. Depending on the chosen algorithm for determining the bit map within a word, one way to design a group is to use an imaginary word with a large number of bits and use the algorithm to map the long word to the memory. The long word is then cut into separate words each time the actual number of bits of a word has been reached.

Simultaneous Reading and Writing

A nonvolatile memory array as claimed in claim 1, wherein the read/write circuit is operative to write a data word of a plurality of sequential bits $b_i$ (i=1 ... N) by reading a current value of bit $b_i$ and only performing a writing operation for bit $b_i$ if the current value and a new value of $b_i$ differ; and performing the conditional write operation for bit $b_i$ and the read operation for bit $b_{i+1}$ simultaneously. As an example, let's suppose that at a certain moment the memory is asked to write four bits on word one which belongs to group one (FIG. 2). It starts reading the cell (1-1), then knowing the information on the cell, it carries out a write operation on cell (1-1) only if the content needs to be changed. At the same time, the memory can carry out reading on the next cell, that is cell (2-2). Because cell (2-2) does not share any line with cell (1-1), reading on cell (2-2) is not interfered by writing on cell (1-1). Next, when the memory proceeds to write on cell (2-2) if so desired, at the same time, it starts to read the next cell (3-1). The write sequence on word 1 ends with writing on cell (4-2) while reading the first cell of the next word to be written. Let's suppose the next word is word 2. The sequence is then: write (5-1) while read (6-2), write (6-2) while read (7-1), write (7-1) while read (8-2), write (8-2) while reading the first cell of the next word to be written. In fact, the next word does not have to be the adjacent word like in the mentioned example. In principle, it can be randomly chosen within the entire memory array. A conflict only occurs if the next word to be written lies on the same pair of word lines as the previous one but in a different group. For example, if word 10 is written after writing on word 3 (they belong to different groups and share the same word lines 3 and 4). In this case the memory controller will decide to read the first bit of the next word after writing the last bit of the previous word. Only in this situation, an extra time for reading the first bit is needed. However, the probability (or frequency) of this situation is quite small, that is only 1/(number of rows). In reality, the number of rows is, say, at least a few hundreds thus the probability (or frequency) of conflict situation is as small as less than 1%.

Circuit Design for a 0T1MTJ MRAM

The circuitry of a conventional MRAM must be modified to allow read-while-write operation. FIGS. 2 and 3 illustrate an exemplary circuit according to the invention for 0T1MTJ using a selection device, such as a diode, in series with an MTJ. The row select circuit 220 can connect at the same time two selected word lines to two separate terminals, one connected to the sensing circuit 230 for reading and the other to the row current source 240 for writing. The current sink 290 is also connected to the word lines for draining the current. The column select circuit 270 ensures that the selected bit lines will be connected to the current sink 250 and to the column current source 260. The unselected bit lines and word lines are connected to proper bias levels as described later. By this arrangement, writing on a bit can be done at the same time with reading the next one. The read/write circuit 280 of the memory is responsible for converting the input address required from the outside of the memory to the actual zigzag type of bitmap inside the memory (according to the formulas above) and it will control the row select circuit 220 and column select circuit 270 to address correctly. A number of methods are possible for biasing the lines during read-while-write operation to block the sneak currents and to avoid mutual interference between read and write when they occur simultaneously.

Figure 4A:
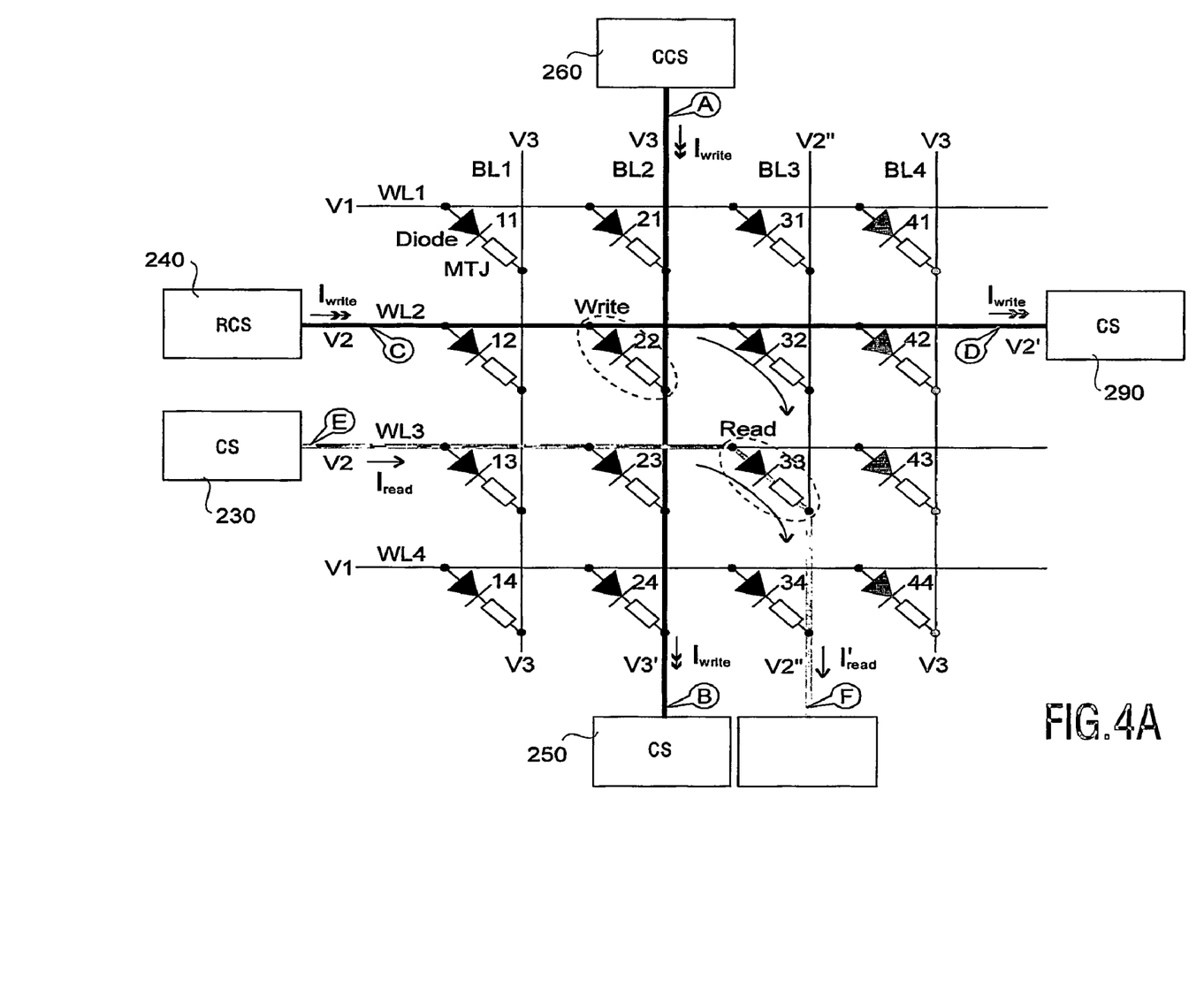
FIG. 4 shows a first embodiment of bias levels for a 0T1MTJ MRAM.
Figure 4B:
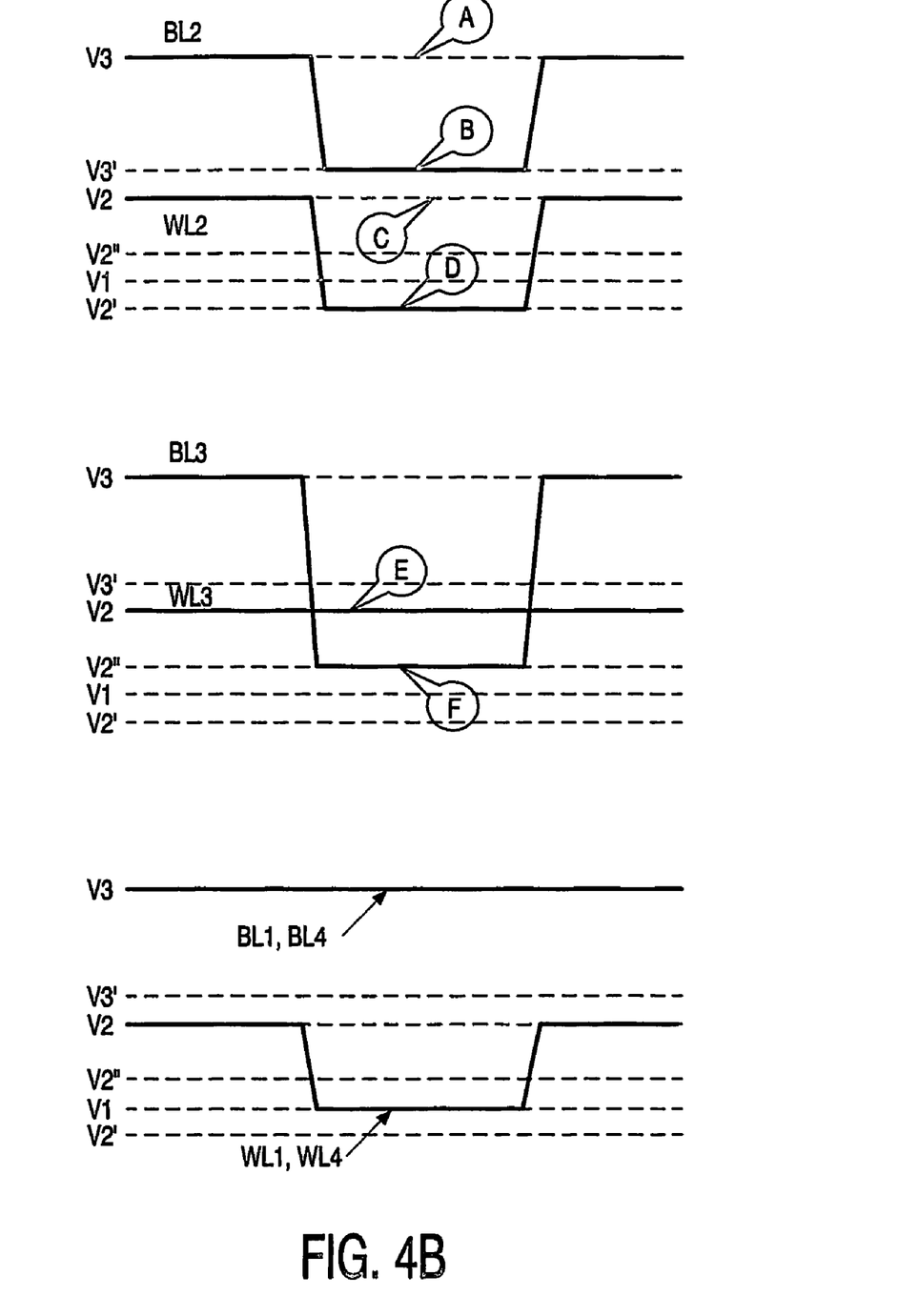

FIG. 4 illustrates a first embodiment for applying the correct bias levels to the cells. In this example, an array of 4 by 4 cells is given. Suppose that during the read-while-write operation, cell (2-2) is selected for write while cell (3-3) is selected for read. In principle, due to the complication of the simultaneous read and write actions, there must be more bias levels than the conventional case needed in order to block sneak currents. In this embodiment three main distinct voltage levels are used: $V_1<V_2<V_3$. When the memory is in standby mode, all bit lines are at $V_3$ while all word lines are at $V_2$, thus all diodes are reverse-biased and there are no currents flowing through the cells. During read-while-write operation, point B of the bit line 2 (BL2) is lowered to $V_3'<V_3$ while point A remains at V3 to draw a write current $I_{write}$ flowing through BL2 (shown in the upper chart of FIG. 4B). Similarly, point D of word line 2 (WL2) is lowered to $V_2'<V_2$ while point C is still at V2 to create a second write current $I_{write}$ through WL2. The two write current pulses can have different timings depending on the write strategy. In the case illustrated here, the two pulses have the same timings. The voltage levels are chosen so that the following relation is satisfied: $V_3 > V_3' > V_2 > V_2'$. This relation is feasible as long as the memory array (or sub-array) does not contain too many cells. This is to ensure that the resistances of the lines are not too large (because of long lines) thus the voltage drops between the ends of the lines (i.e. $V_3-V_3'$ or $V_2-V_2'$) are not too large in order to keep the difference $V3-V2'$ still smaller than the supply voltage of the chip. For instance, calculation shows that with Cu lines having thickness of 150 nm, width of 200 nm and length of about 100 μm (equivalent to about >300 cells in one dimension), the voltage drop between the ends of the line is about 0.5V if 10 mA is required for writing. With the typical supply voltage of the chip of 3V, the mentioned relation is well feasible. The relation mentioned above is to ensure that during writing, all diodes in the entire array are reverse-biased.

Referring now to the read action, at the same time BL3 is set to $V_2'' < V_2$ (see the middle chart of FIG. 4B) to create a sense current from WL3 (still at V2) through cell (3-3) to BL3, as shown in FIG. 4A. The difference $V_2-V_2''$ is relatively small, in the order of a few hundreds mV. Also at the same time, all unselected word lines, namely WL1 and WL4, are biased to V1 which is smaller than $V_2''$ (the bottom chart of FIG. 4B). It is not constrained that $V_1$ must be higher than $V_2'$ as in this example; it can also be smaller. In the example of FIG. 4, cell (2-2) is chosen for writing while cell (3-3) is chosen for reading. Write currents flow through the bold black paths and read (sense) current flows through the gray path.

With the above biasing scheme, during the read-while-write operation, all diodes are reverse-biased thus conduct no currents, except diode (3-3) being sensed and sometimes, diode (3-2). Diode (3-3) is forward-biased thus allows a sense current passing through from the sensing circuit to the current sink. By converting the current to voltage inside the sensing circuit, the state of cell (3-3) can be detected. Sometimes, diode (3-2) can be forward-biased as well. This may occur when this diode is located near the end at point C on the word line, thus the voltage on the p electrode of the diode might be larger than the n electrode, being bias at V2''. A small current will sneak from the write current and flow though cell (3-2) to join the sense current, resulting in a slightly higher current at point F. However, the situation does not pose any problem since the sensing circuit senses only the current flowing through point E, thus through the selected cell (3-3). The current through (3-2) will extract some amount from the write current in WL2. However it is negligible small compared to the write current and does no harm to the write operation.

Figure 5A:
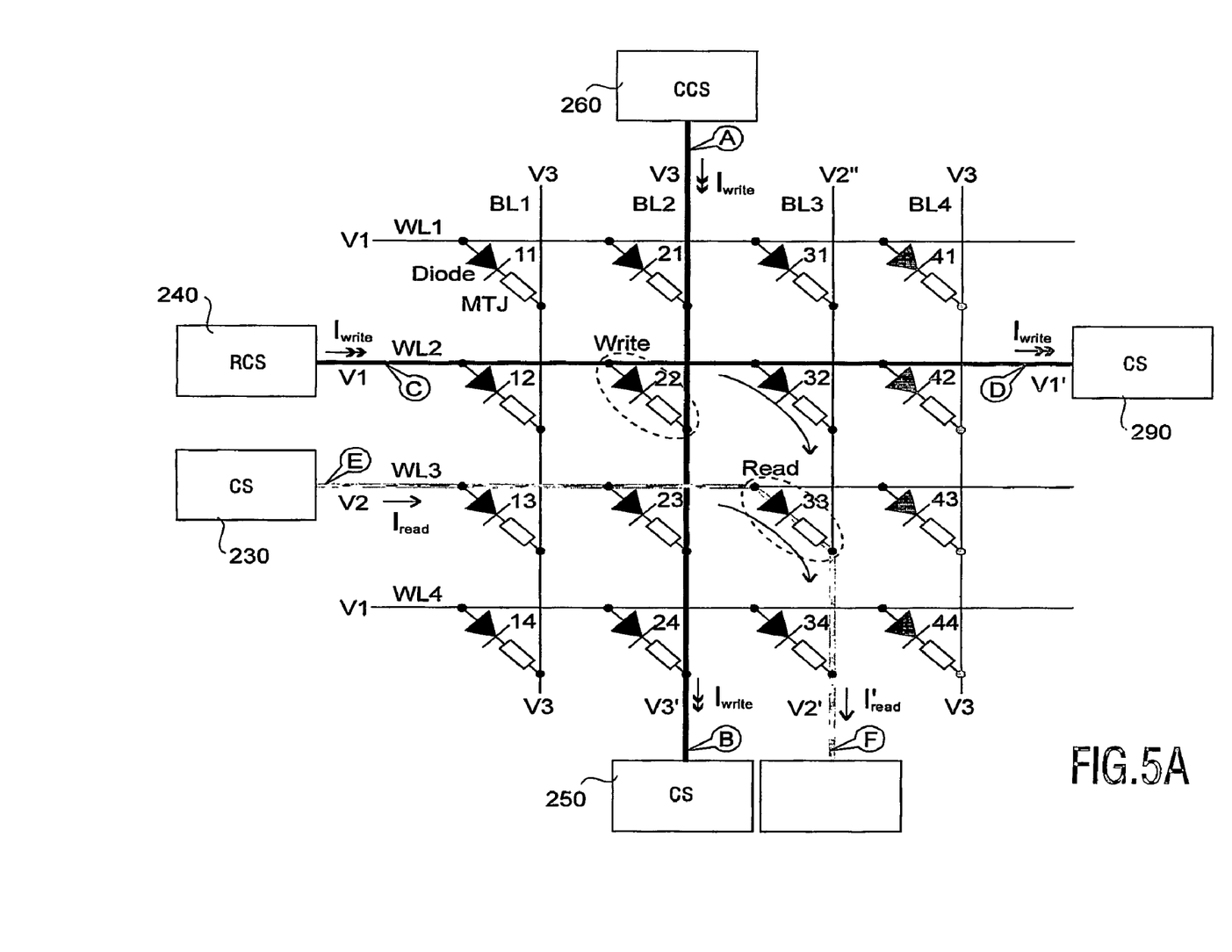
FIG. 5 shows a second embodiment of bias levels for a 0T1MTJ MRAM.
Figure 5B:
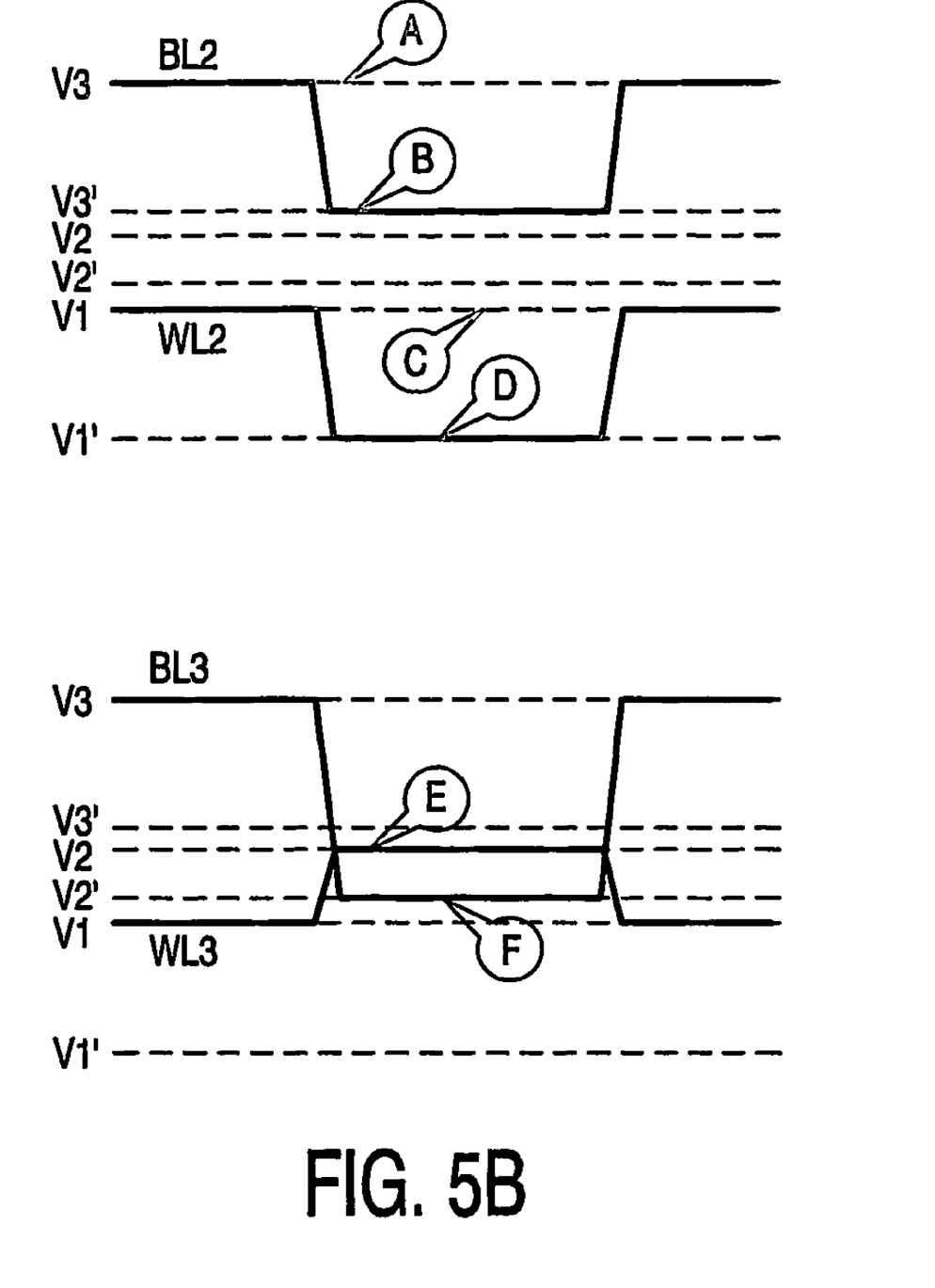

In the first embodiment, during read-while-write operation, there is some chance that a small amount of write current may leak into the sensed path, even though it has been proved that this does not pose a problem. FIG. 5 shows a second embodiment with a different bias scheme. The advantage of this scheme is that it blocks completely all sneak currents. The charts in FIG. 5B give relations of the voltage levels used for biasing: $V_3 > V_3' > V_2 > V_2' > V_1 > V_1'$. The differences $V_3-V_3'$ and $V_1-V_1'$ are the voltage drops on the bit line and word line, respectively, during write. The difference $V_2-V_2'$ is used to create a sense current through the sensed path. Because the write current is much larger than the read current, $V_2-V_2'$ is smaller than $V_3-V_3'$ or $V_1-V_1'$. The array must be designed so that the mentioned relation is satisfied and the total difference in all levels must be within the supply voltage of the chip. During standby, all bit lines are biased at $V_3$, while all word lines are biased at $V_1$. All diodes are blocked because they are reverse-biased. During read-while-write operation, point B of BL2 is pulled down to $V_3'$ to create a write current. Similarly, point D of WL2 is pulled down to $V_1'$ to draw a write current. At the same time BL3 is set to $V2'$ while WL3 is raised to V2, creating a forward-bias on diode (3-3), thus allows a sense current passing though cell (3-3). In this case all diodes are reverse-biased and blocked except diode (3-3) at the cell being read. In FIG. 5, cell (2-2) is chosen for writing while cell (3-3) is chosen for reading. Write currents flow through the bold black paths and read (sense) current flows through the gray path.

It will be appreciated that the invention is not limited to a MRAM structure that includes a MTJ stack deposited on top of a p-n junction diode stack. It can equally well be applied to any structure that contains a MTJ stack and a stack as a selection device, such as a non linear metal-insulator-metal stack, a Camel diode, a planar doped barrier device or a backward diode. Persons skilled in the art will be able to design different bias schemes for these cases.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The words "comprising" and "including" do not exclude the presence of other elements or steps than those listed in a claim.

The invention claimed is:

1. A nonvolatile memory array including:
   a first plurality of electrically conductive lines (hereinafter "word lines");
   a second plurality of electrically conductive lines (hereinafter "bit lines");
   a plurality of memory cells, each memory cell being located at an intersection region of one of the word lines and one of the bit lines; and
   a read/write circuit for reading/writing a data word including a plurality of bits; the circuit being operative to map each pair of sequential bits of the data word to a respective pair of memory cells located at intersection regions of both a different word line and a different bit line.

2. A nonvolatile memory array as claimed in claim 1, wherein the read/write circuit is operative to write a data word of a plurality of sequential bits $b_i$ (i=1 ... N) by reading a current value of bit $b_i$ and only performing a writing operation for bit $b_i$ if the current value and a new value of $b_i$ differ; and performing the conditional write operation for bit $b_i$ and the read operation for bit $b_{i+1}$ simultaneously.

3. A nonvolatile memory array as claimed in claim 1, wherein a data word includes a plurality of sequential bits $b_i$ (i=1 ... N) indicated by a word memory address; the read/write circuit being operative to convert the word memory address to a corresponding physical memory address for bit $b_1$ which includes a word line number $y_t$ and a bit line number $x_1$ and to generate respective bit addresses for the successive bits in the word by each time incrementing the bit line number and changing the word line number $(y_{i+1} \neq y_i)$.

4. A nonvolatile memory array as claimed in claim 3, wherein the read/write circuit is operative to determine $y_{i+1}$ as:

$y_{i+1} = y_1 + ((x_1+i+1) \text{ MOD } 2)$, if $y_1$ is odd and
$y_{i+1} = y_1 - ((x_1+i+1) \text{ MOD } 2)$, if $y_1$ is even,
for i=1 ... N−1.

5. A nonvolatile memory array as claimed in claim 1, wherein the read/write circuit is operative to map a group of a plurality of words with respective sequential addresses such that for each word $W_i$ and $W_k$ of the group a sequentially last bit of word $W_i$ and a sequentially first bit of word $W_k$ are mapped to a respective pair of memory cells located at intersection regions of both a different word line and a different bit line.

6. A nonvolatile memory array as claimed in claim 1, wherein each memory cell includes a magnetic tunnel junction.

7. A nonvolatile memory array as claimed in claim 6, wherein each memory cell includes a selection device electrically connected in series with the magnetic tunnel junction.

8. A method of converting an address for accessing a data word in a nonvolatile memory as claimed in claim 1 to a sequence of identifications of memory locations, where a data word includes a plurality of sequential bits $b_i$ (i=1 . . . N) indicated by a word memory address; the method including converting the word memory address to a corresponding physical memory address for bit $b_1$ which includes a word line number $y_1$ and a bit line number $x_1$ and to generate respective bit addresses for the successive bits in the word by changing the bit line number ($x_{i+1} \neq x_i$) and changing the word line number ($y_{i+1} \neq y_i$), for i=1 . . . N−1.

9. A method of converting an address as claimed in claim 8, wherein in the step of changing the bit line number includes incrementing the bit line number.

10. A method of converting an address as claimed in claim 9, wherein the step of changing the word line number includes determining $y_{i+1}$ as:

$y_{i+1} = y_1 + ((x_1+i+1) \text{ MOD } 2)$, if $y_1$ is odd and $y_{i+1} = y_1 - ((x_1+i+1) \text{ MOD } 2)$, if $y_1$ is even, for i=1 . . . N−1.

* * * * *